United States Patent [19]

Zimmerman

[11] Patent Number: 5,535,311
[45] Date of Patent: Jul. 9, 1996

[54] METHOD AND APPARATUS FOR IMAGE-TYPE DETERMINATION TO ENABLE CHOICE OF AN OPTIMUM DATA COMPRESSION PROCEDURE

[75] Inventor: Gary Zimmerman, Boise, Id.

[73] Assignee: Hewlett-Packard Company, Palo Alto, Calif.

[21] Appl. No.: 282,399

[22] Filed: Jul. 28, 1994

[51] Int. Cl.⁶ ............................................. G06K 15/00
[52] U.S. Cl. ............................................. 395/114; 395/112
[58] Field of Search ........................ 340/735; 358/296, 358/133, 86; 395/112, 114, 164; 400/121; 341/51

[56] References Cited

U.S. PATENT DOCUMENTS

| | | | |
|---|---|---|---|
| 4,942,390 | 7/1990 | Do et al. ........................ | 340/735 |
| 5,155,484 | 10/1992 | Chambers, IV ................ | 341/55 |
| 5,179,378 | 1/1993 | Ranganathan et al. ......... | 341/51 |
| 5,207,517 | 5/1993 | Ito ................................... | 400/121 |
| 5,208,676 | 5/1993 | Inui ................................. | 358/296 |
| 5,228,118 | 7/1993 | Sasaki ............................. | 395/112 |
| 5,231,485 | 7/1993 | Israelsen et al. ............... | 358/133 |
| 5,247,348 | 9/1993 | Israelsen et al. ............... | 358/86 |
| 5,247,357 | 9/1993 | Israelsen ......................... | 358/133 |
| 5,293,466 | 3/1994 | Bringmann ..................... | 395/114 |
| 5,375,204 | 12/1994 | Motoyama et al. ............ | 395/164 |
| 5,408,542 | 4/1995 | Callahan ......................... | 382/56 |

Primary Examiner—Mark R. Powell
Assistant Examiner—Steven P. Sax

[57] ABSTRACT

A method for identifying an image type of a multi-pixel image is employed in an apparatus that includes multiple data compression procedures. The data compression procedures operate with varying efficiencies on different image types. Pixels defining an image are represented by binary 1/0 values that are arranged in n-bit data segments (e.g., bytes). The method includes the steps of: counting a number of 1-to-0 and 0-to-1 transitions in each data segment; finding an average number of transitions over all data segments wherein such transitions occur; determining for all data segments in the multi-pixel image, a transition array comprising cumulative numbers of data segments having 0, 1, 2, ... n-1 transitions, respectively; and employing the average number of transitions per data segment and the transition array to identify a data compression procedure to be employed for the multi-pixel image.

9 Claims, 3 Drawing Sheets

IMAGE

```
00000000  00000000  01111110  00000000  00000000
00000000  00000011  11111111  11000000  00000000
00000000  00001111  00000000  11110000  00000000
00000000  00111100  00000000  00111100  00000000
00000000  11110000  00000000  00001111  00000000
00000000  11111111  11111111  11111111  00000000
00000000  11111111  11111111  11111111  00000000
00000000  11110000  00000000  00001111  00000000
00000000  11110000  00000000  00001111  00000000
00000000  11110000  00000000  00001111  00000000
```

TOTAL # BYTES WITH TRANSITIONS: 15

TOTAL # TRANSITIONS: 18

AVERAGE # TRANSITIONS: 1.20

FIG. 3

TRANSITIONS

| 0 | 1 | 2 | 3 | 4 | 5 | 6 | 7 |
|---|---|---|---|---|---|---|---|
| 4 | 0 | 1 | 0 | 0 | 0 | 0 | 0 |
| 3 | 2 | 0 | 0 | 0 | 0 | 0 | 0 |
| 3 | 2 | 0 | 0 | 0 | 0 | 0 | 0 |
| 3 | 0 | 2 | 0 | 0 | 0 | 0 | 0 |
| 3 | 2 | 0 | 0 | 0 | 0 | 0 | 0 |
| 5 | 0 | 0 | 0 | 0 | 0 | 0 | 0 |
| 5 | 0 | 0 | 0 | 0 | 0 | 0 | 0 |
| 3 | 2 | 0 | 0 | 0 | 0 | 0 | 0 |
| 3 | 2 | 0 | 0 | 0 | 0 | 0 | 0 |
| 3 | 2 | 0 | 0 | 0 | 0 | 0 | 0 |
| 35 | 12 | 3 | 0 | 0 | 0 | 0 | 0 |

FIG. 4

METHOD AND APPARATUS FOR IMAGE-TYPE DETERMINATION TO ENABLE CHOICE OF AN OPTIMUM DATA COMPRESSION PROCEDURE

FIELD OF THE INVENTION

This invention relates to page printers and, more particularly, to a method and apparatus for determining an image type to enable a page printer to compress data describing the image using an optimum data compression procedure.

BACKGROUND OF THE INVENTION

To control the costs of page printers, substantial efforts have been directed at reducing the amount of memory required to store page data. Recently, 600 dot per inch resolution laser printers have been introduced. Such printers handle both text, line art and half-tone images. To minimize the amount of memory required in such printers, data compression techniques have been applied to image data. For instance, run length data compression is used by most processors when transferring data to the printer. While run length compression is successful when used with text and line art, when used with image data, its compression capability is much less satisfactory.

Certain types of images are classified as "ordered dither" or "error diffused". An ordered dither image (also called "clustered") is a half-tone image that includes half-tone gray-level representations. Such an image generally reflects substantial data redundancy and lends itself to a data encoding technique that is lossless in nature. A "lossless" compression technique is one which enables image compression and decompression with no loss of information present in the original image. Error diffused images (a form of "dispersed" dither), by contrast, exhibit little redundancy in their data and require different methods of compression. A "Bayer" dither is another example of a dispersed dither.

To accommodate a variety of image types, while still maintaining a reduced amount of on-board image memory, page printers employ multiple data compression techniques to obtain most efficient compression of image data. In addition to run-length (i.e. "Huffman") encoding, page printers employ varieties of the Lempel-Ziv data compression technique, a cache-based predictor technique, a lossy technique and others. The Lempel-Ziv procedure has several variations but, in general, compresses an input data stream by storing, in a string table, strings of characters encountered in an input data stream. A "compressor" searches the input data stream to determine a longest match to a stored string in the string table. When a match is found, a code corresponding to the matching string is issued. As the compressor encounters more and more strings, the string table becomes "smarter" and succeedingly longer runs of characters are able to be compressed by the issued codes. At the receiving end, an identical string table is constructed which enables a decoding of the received code. It is known that Lempel-Ziv techniques are especially effective at compressing text and line art data.

The cache-based predictor (CBP) technique is described in U.S. patent application Ser. No. 07/963,201, entitled "Cache-Based Data Compression/Decompression, to Rosenberg et al and assigned to the same assignee as this application. The disclosure of the Rosenberg et al Patent Application is incorporated herein by reference.

The basic premise of CBP is to use past received data to predict future data. In CBP, most recently encountered bytes are cached and, depending upon how recently a byte has been used, a variable length bit code is output for each byte encountered. There are a variety of implementations for CBP. Some employ a table of each possible byte value and the predicted byte that will follow it. Others, in lieu of providing a table of each possible byte, employ bytes received in a prior byte stream and compare those bytes with a byte, for which a prediction is to be made.

As an example of CBP, a printer is supplied with a bit map memory that comprises a raster image of pixels, each pixel represented by a binary bit value. Each raster scan row is divided into a series of 8 bit bytes. Surrounding pixels which are spatially positioned so as to have been previously decoded, are used as a context for deciding which of plural caches is to be used to store a most recently used byte. Bit values from surrounding pixels are combined to form a number, enabling a context values (or index) to be derived which specifies which cache should be used.

When a new data byte is encountered that is to be transmitted, a cache is addressed having an address of the context byte which is vertically aligned (for example) on an immediately previous scan row of the pixel image. It is likely that the most recently used entry in the addressed cache will be identical to the uncompressed byte value. The byte value is then matched with the values in the addressed cache and if a match is found, a code word indicating the position of the matching value in the addressed cache is outputted. The cache is then adapted by moving if necessary, the matching value up to the most recently used entry in the addressed cache and the procedure repeats.

If no match is found in the addressed cache a "not found" code word is outputted and the actual byte value is transmitted. The non-matching byte value is inserted in the addressed cache and the cache is adapted so as to move the displaced byte into a lower level of the cache and to displace a byte already in that lower level, etc. The procedure then repeats.

In summary, a current row byte will always be directed to a cache whose address is the value of the context byte immediately above the current byte. The current byte becomes a context byte when the next scan row is accessed. If the context byte value is already an address of a cache, a new cache does not need to be created. If the context byte value is new, a new cache is established with the context byte as its address.

In the above CBP implementation, a context value consists of the value of a data segment from a raster scan line immediately above the current line. That context value is used as a cache address. The context value can also be formed from a combination of previously decoded data segments. Thus, not only the data segment directly above the current data segment may be used, but a piece of the data segment immediately above and to the left of the current data segment may also be used.

CBP performs well when used to compress typical cluster image data. Bayer and fine clustered image data and data comprising multiple vertical lines.

Lossy compression is generally used as a last resort because it results in lost data from the image which can not be recovered. Images that generally fall into a category where lossy compression is applied are images that have been half-toned using an error diffusion procedure. Lossy compression involves a reduction in size of image data (in a data cell of an image) to an approximation cell which replaces the original cell. For instance, a 4×4 bit cell of raster video data may be compressed to four bits. Thus, a 4:1 compression is achieved, but substantial data is lost and is not recoverable upon decompression.

In U.S. patent application Ser. No. 07/940,111 of Campbell et al., assigned to the same assignee as this application, an adaptive data compression procedure is described for a page printer. Campbell et al. describe a method for choosing a data compression procedure which enables optimum data compression to be achieved. However, the Campbell et al. procedure requires that each compression technique actually be tried upon a portion of a received image to determine which compression technique works best. While the Campbell et al. procedure is highly effective in achieving substantial data compression, at times, substantial processing time is required to arrive at a decision as to which method of data compression is best for the received image.

Accordingly, it is an object of this invention to provide a page printer which includes a variety of data compression procedures and is adaptive in choosing a data compression procedure, based upon characteristics of received data.

It is another object of this invention to provide a page printer which intelligently selects a data compression technique so as to enable efficient use of limited printer memory.

It is yet another object of this invention to provide a page printer with a system for data compression which does not require a test and retry procedure to decide upon a compression procedure to be employed.

SUMMARY OF THE INVENTION

A method for identifying an image type of a multi-pixel image is employed in an apparatus that includes multiple data compression procedures. The data compression procedures operate with varying efficiencies on different image types. Pixels defining an image are represented by binary 1/0 values that are arranged in n-bit data segments (e.g., bytes). The method includes the steps of: counting a number of 1-to-0 and 0-to-1 transitions in each data segment; finding an average number of transitions over all data segments wherein such transitions occur; determining for all data segments in the multi-pixel image, a transition array comprising cumulative numbers of data segments having 0, 1, 2, ... n-1 transitions, respectively; and employing the average number of transitions per data segment and the transition array to identify a data compression procedure to be employed for the multi-pixel image.

DESCRIPTION OF THE DRAWINGS

FIG. 3 is an array of bytes which illustrate binary pixel values, that define the letter A.

FIG. 4 illustrates a transition array for the array of FIG. 3.

DETAILED DESCRIPTION OF THE INVENTION

Hereafter, the invention will be described in the context of a pixel image wherein each pixel is represented by a binary 1 or a binary 0 value. Further, the image is segmented into bytes, each byte comprising 8 pixel bits. Thus, while bytes will be hereinafter described, it is to be understood that other data segment lengths may be employed (e.g., 2 bytes, 4 bytes, etc.). Further, it is to be understood that the invention need not be applied to a complete image of a page as received in a page printer, but may be applied to a portion of a page image which is reasonably representative of the type of data contained on the entire page. Thus, if the printer is of the type which operates upon page "strips", wherein each strip comprises a horizontal section of a page, one or more of such strips may be analyzed in accordance with the invention to determine the data compression technique to be applied to all page strips that comprise the page.

Figure 1:
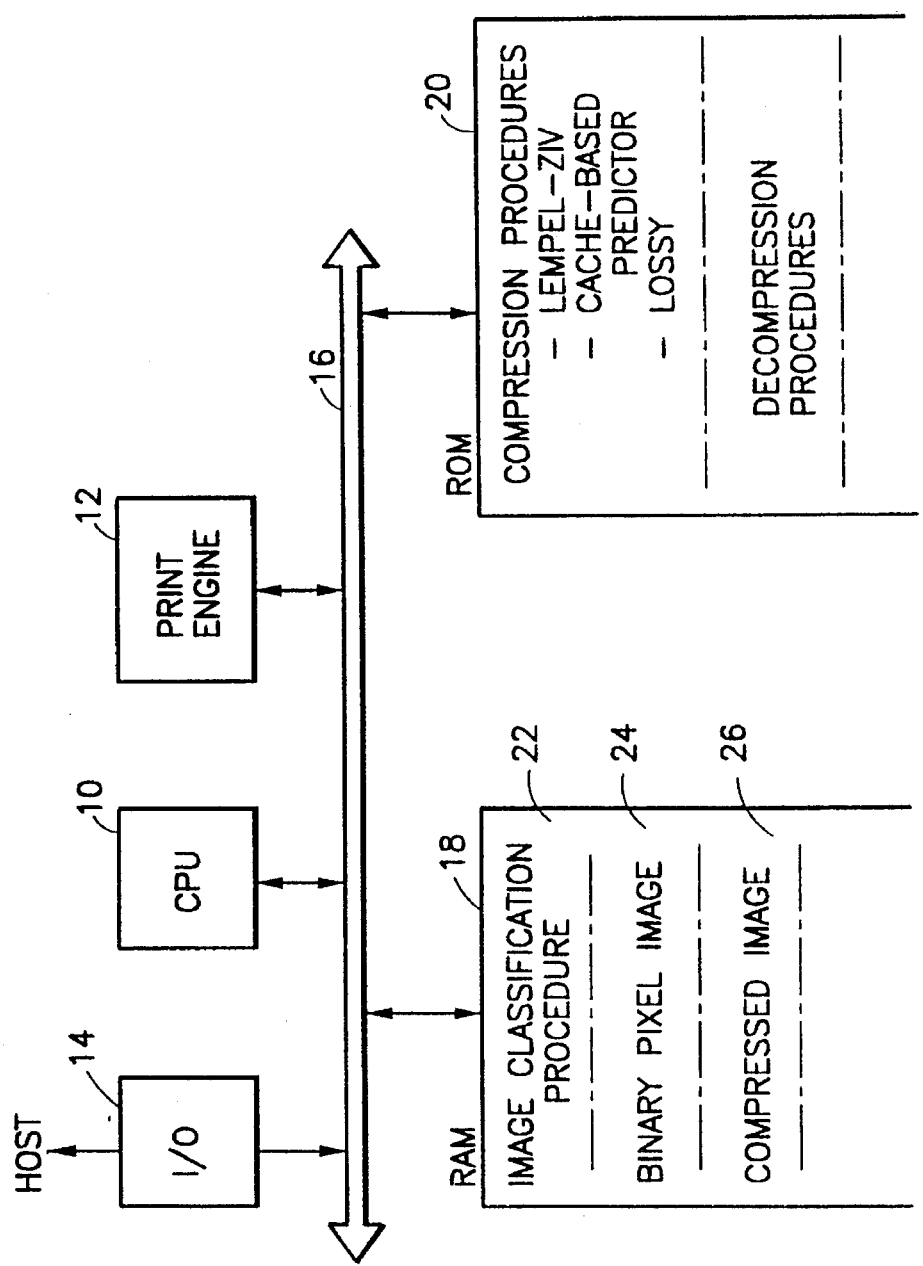
FIG. 1 is a high level block diagram of a printer adapted to carry out the invention hereof.

Turning now to FIG. 1, a high level block diagram is shown of a printer which includes a central processing unit (CPU) 10, a print engine 12 and an input/output interface module 14 which communicates with a host processor. Print engine 12 may comprise a laser printer or an ink jet printer or other equivalent print mechanism. A bus 16 enables communication between the various elements of the printer and further connects to a random access memory (RAM) 18 and a read only memory (ROM) 20. ROM 20 contains plural compression procedures that may be called upon to data compress a binary pixel image 24 stored in RAM 18. Various compression and decompression procedures are present in ROM 20, including a Lempel-Ziv compression procedure, a lossy compression procedure, and a cache-based predictor compression procedure. Other compression and decompression procedures may also be present in ROM 20.

Within RAM 18, an image classification procedure 22 (to be hereafter described in detail) enables one of the compression procedures in ROM 20 to be selected that is best suited to a binary pixel image 24. By "best suited" is meant that the selected compression procedure will enable a best available data compression of the pixel image, given the image's determined characteristics. Once pixel image 24 is compressed, its area of FAM 18 is released to be used for a next image portion and the compressed image is stored in area 26 of RAM 18. When print engine 12 is ready to receive image data for printing, a decompression procedure is called from ROM 20 to recreate the binary pixel image and to transfer that image to an image buffer (not shown) associated with print engine 12. Thereafter, print engine 12 provides a hard copy output of the binary image.

Figure 2:
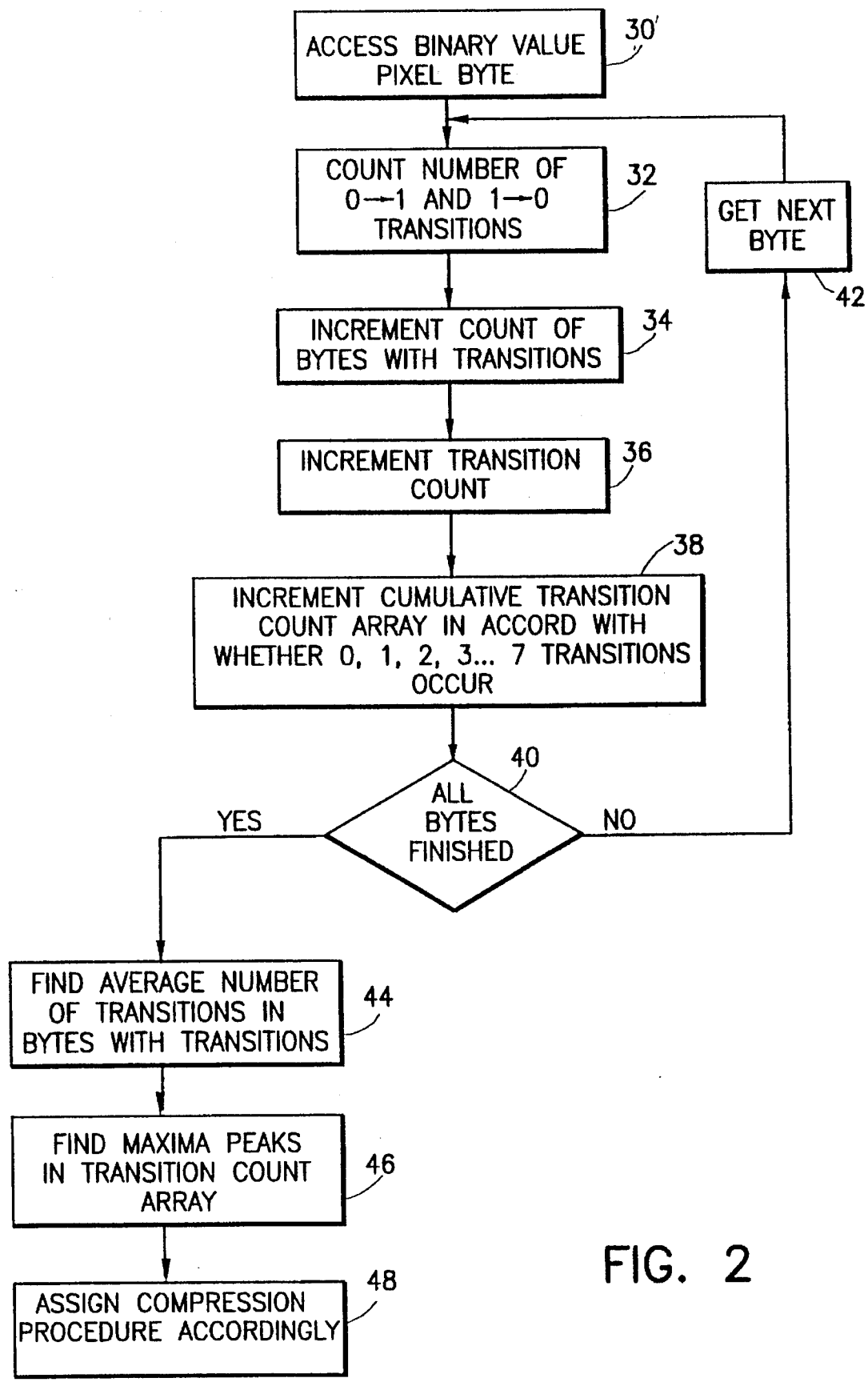
FIG. 2 is a logical flow chart which illustrates the procedure of the invention.

Referring now to FIG. 2, the procedure will be described that is followed by the system of FIG. 1 to classify an image's dither type. Initially, a binary value pixel byte is accessed (box 30) and the number of 0 to 1 and 1 to 0 transitions in the byte are counted (from 0 to 7) (box 32). Next, if the byte includes any transitions, a count of "bytes with transitions" is incremented (box 34) and a cumulative count of number of transitions experienced over the image in bytes with transitions is also incremented (box 36). A transition count array is established (box 38) and is incremented in accordance with whether the byte under consideration includes 1, 2, 3, 4, 5, 6, or 7 transitions. In other words, the transition array comprises 7 "buckets" which individually accumulate the number of bytes having 1 transition, the number of bytes having 2 transition, the number of bytes having 3 transitions, ... etc. Bytes with no transitions are not tallied as they do not add useful information (e.g. many images have large areas of black or white).

After the above noted values have been accumulated, it is determined whether all bytes of the image (or image portion) are finished (decision box 40). If not, a next byte is accessed (box 42) and the procedure repeats. If all bytes are finished, image classification procedure 24 then calculates the average number of transitions of all bytes having transitions (box 44). The average number of transitions per byte (which have transitions) represents a coarse indication of the level of clustering of the image.

A more precise classification of the type of image dither is found in box 46 wherein the transition count array is examined to find whether the array indicates the single maxima or plural maxima and the positions of the single or plural maxima. The transition array enables a determination to be made of where the peaks are in terms of the number of transitions per byte and is indicative of the size and frequency of runs of on or off pixels in the image. The transition array provides a measure of the clustering of the dots of the image at a fine level of detail—thereby enabling an even better classification of the dither type of the image, when combined with the average number of transitions per byte.

Once the aforesaid values have been determined, a compression procedure is assigned (box 48) based upon the type of dither determined. For instance, it has been found that the Lempel-Ziv compression procedure operates best upon text and line art; and that text and line art are indicated by one peak in the transition array accompanied by less than 1.3 transitions per byte for bytes having transitions. By contrast, a lossy compression procedure is indicated for use when an error diffusion dither is found. An error diffusion dither is indicated by more than one peak in the transition array, where peaks are at even numbers in the array (either 2, 4, 6 or 8), combined with an average number of transitions per byte of bytes with transitions that is greater than 2.5 per byte. Any other type of dither (i.e., cluster, fine cluster, vertical line) is best handled by cache-based predictor compression. These classifications are found in Table 1 below.

analyzed to find the number of transition peaks and the average number of transitions per byte with a transition. The results of that analysis are shown in Tables 2 and 3 with Table 2 indicating the experimental data derived by the examination of various images indicated along the left column. Table 3 is a compilation of image characteristics determined from the experimental data shown in Table 2.

TABLE 2

| Image | Resolution | Dither | Transition Peaks | Avg # Transitions |
| --- | --- | --- | --- | --- |
| design | 600 | Text | 1 | 0.673 |
| peak | 600 | Fine Clustered | 3 | 2.848 |
| peak | 600 | Bayer | 4 | 3.546 |
| north | 600 | Cluster | 2 | 1.382 |
| kabuki | 300 | ErrDiff | 2,4 | 3.083 |
| jyoung | 300 | Cluster | 2 | 1.536 |
| einstein | 300 | ErrDiff | 2,4 | N/A |
| fullmtn | 300 | Bayer? | 4 | 3.637 |
| sailboat | 300 | LineArt | 1 | 1.331 |
| newsletl | 300 | Text | 1 | 0.882 |
| hiex90 | 300 | ErrDiff | 2,4 | 4.659 |
| london | 300 | ErrDiff | 2,4,6 | 4.384 |
| climb | 300 | Fine Clustered | 4 | 2.968 |
| climb | 300 | Cluster | 1 | 1.312 |
| climb | 300 | VertLine | 1,3,5 | 2.674 |
| climb | 300 | Bayer | 3 | 2.891 |
| sub | 300 | Fine Clustered | 4 | 3.202 |
| sub | 300 | Cluster | 2 | 1.423 |
| sub | 300 | VertLine | 1,3,5 | 2.734 |
| sub | 300 | Bayer | 3 | 2.986 |
| phone | 300 | Text | 1 | 1.274 |
| sawtooth | 300 | Text/Cluster | 2 | 1.165 |

TABLE 1

| Dither | Local Maxima in Transition Array | Avg Trans/Byte of Bytes w/Trans | Compression |
| --- | --- | --- | --- |
| Text & Line Art | 1 | Avg < 1.30 | LZ |
| Clustered (typical) | 1 or 2 | 1.30 < Avg < 1.75 | CBP |
| Bayer, Fine Clustered | 3 or 4 | 2.75 < Avg < 4.00 | CBP |
| Vertical Line | Multiple, 1,3,5 or 7 | 2.50 < Avg < 3.00 | CBP |
| Error Diffusion | Multiple, 2,4,6 or 8 | 2.60 < Avg | Lossy |

Turning now to FIG. 3, an example is shown of an image array of an A which comprises 10 rows of 5 bytes of binary pixel values. The first and last columns contain only zeroes and no transitions. The second third and fourth columns contain either 1 transition or no transitions. As indicated at the bottom of FIG. 3, the total number of bytes with transitions is accumulated (i.e., 15) and the total number of transitions throughout all bytes of the image total 18. Thus, the average number of transitions is 1.2 per byte (with transitions) for the displayed image.

The corresponding transition array for the image of FIG. 3 is shown in FIG. 4. There, it is seen that of the 50 bytes in the image of FIG. 3, 32 bytes have no transitions, 12 bytes have 1 transition and 3 bytes have 2 transitions. No bytes have more than 2 transitions. A maxima in the transition array of FIG. 3 occurs at the 1 position (because 0 transition entries are ignored). Accordingly, Table 1 determines that Lempel-Ziv compression should be applied because there is one local maxima in the transition array and the average number of transitions per byte (of bytes with transitions) is less than 1.3.

EXPERIMENTAL DATA

To assure that various types of dither images can be classified according to a dither-type or half-toning technique (or class of techniques), a number of dither images were TABLE 2-continued

| Image | Resolution | Dither | Transition Peaks | Avg # Transitions |
| --- | --- | --- | --- | --- |
| eye | 300 | ErrDiff | 2,4 | 2.942 |
| moon | 300 | ErrDiff | 2,6 | 5.000 |

TABLE 3

| Dither | Peaks | Avg # Trans |
| --- | --- | --- |
| Text | 1 | less than 1.30 |
| LineArt | 1 | 1.30 |
| Cluster | 1 or 2 | 1.30 to 1.75 |
| Bayer | 3 or 4 | 2.85 to 3.75 |
| Fine Clustered | 3 or 4 | 2.75 to 3.25 |
| VertLine | Multiple, Odd | 2.50 to 3.00 |
| ErrDiff | Multiple, Even | 2.50 and up |

When Table 3 is examined, it can be determined that there are groups of dither types which behave in similar fashion. Thus, for the purposes of determining an image dither type, an inability to determine between two similar dither types is unimportant as the characteristics of the dither types are the determining factors.

Since it is known that cache-based predictor compression works well upon clustered, vertical line, Bayer and fine clustered image dithers, the assignments shown in Table 1 are based upon the characteristics determined in Table 3. The Lempel-Ziv compression procedure (and variations thereof) is applied to line—art and text. Lossy compression is applied when an error diffusion image is determined. The assignment of a compression technique requires no performance of a trial compression upon the image. The technique is also fast, considering the detailed information which it produces.

The procedure further allows images which have been compressed using more than one technique, say text, line art and a Bayer-dithered image, to be given a single classification which represents the compressibility of the overall image. Further, while the technique is useful for selecting appropriate compression techniques for images, the technique may also be used to appropriately perform other image processing tasks. For instance, it may be used to determine whether a cache-based predictor or lossy procedure will improve the compression of a Lempel-Ziv compressed image as well as what dither type should be used when decompressing lossy data to best represent the original image. Also, it may be used to determine a type of dither applied to certain images on a page so that further images to be placed on the page from another source can be subjected to the same dither pattern (for image consistency purposes).

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for identifying an image type of a multi-pixel image and assigning a compression procedure therefor, said method performed by apparatus that includes multiple data compression procedures, said method analyzing an image portion comprising plural data segments, each data segment including plural binary pixel values, said method comprising the steps of:

counting a number of transitions of binary value in each said data segment;

finding an average number of transitions of binary value over all data segments that include at least one transition;

determining for all data segments in said multipixel image, a transition array comprising cumulative sums of data segments having like numbers of transitions of binary value; and employing said average number of transitions of binary value and said cumulative sums of pixels from said transition array to identify said image type.

2. The method as recited in claim 1 wherein identification of said image type determines a dither pattern of said image.

3. The method as recited in claim 1 wherein said image type identification enables selection of a data compression procedure to be applied to said multi-pixel image.

4. The method as recited in claim 3 wherein if said transition array indicates a single local maxima value and said average number of transitions per byte for bytes having transitions is less than approximately 1.3, said employing step selects a Lempel-Ziv data compression procedure to data compress said multi pixel image.

5. The method as recited in claim 3 wherein if said transition array indicates one or two local maxima values and said average number of transitions per byte for bytes having transitions is greater than approximately 1.3 and is less than approximately 1.75, said employing step selects a Cache-based predictor data compression procedure to data compress said multi pixel image.

6. The method as recited in claim 3 wherein, if said transition array indicates three or four local maxima values and said average number of transitions per byte for bytes having transitions is greater than approximately 2.75 and is less than approximately 4, said employing step selects a Cache-based predictor data compression procedure to data compress said multi-pixel image.

7. The method as recited in claim 3 wherein, if said transition array evidences plural local maxima of even numbers of transitions, and said average transitions per data segment of data segments with transitions is greater than approximately 2.5 per data segment, said employing step selects a lossy data compression procedure to be employed with said multi-pixel image.

8. The method as recited in claim 3 wherein, if said transition array evidences plural local maxima of odd numbers of transitions, and said average transitions per data segment of data segments with transitions is greater than approximately 2.5 and less than approximately 3 per data segment, said employing step selects a cache-based predictor compression procedure to be employed with said multi-pixel image.

9. The method as recited in claim 1 wherein each said data segment is an 8-bit byte.

\* \* \* \* \*